United States Patent [19]
McCoy et al.

[11] Patent Number: 5,648,854
[45] Date of Patent: Jul. 15, 1997

[54] ALIGNMENT SYSTEM WITH LARGE AREA SEARCH FOR WAFER EDGE AND GLOBAL MARKS

[75] Inventors: John H. McCoy, San Carlos; Kyochi Suwa, San Mateo, both of Calif.

[73] Assignee: Nikon Corporation, Tokyo, Japan

[21] Appl. No.: 425,131

[22] Filed: Apr. 19, 1995

[51] Int. Cl.$^6$ .................................................. G01B 11/00
[52] U.S. Cl. ........................ 356/399; 356/401; 250/548
[58] Field of Search .................................. 356/399–401, 356/363, 375, 356, 358, 426, 150; 250/548, 557, 561

[56] References Cited

U.S. PATENT DOCUMENTS

| | | | |
|---|---|---|---|
| 3,930,684 | 1/1976 | Lasch, Jr. et al. | 302/2 R |
| 4,376,581 | 3/1983 | Mayer | 355/77 |
| 4,385,838 | 5/1983 | Nakazawa et al. | 356/399 |
| 4,475,122 | 10/1984 | Green | 358/101 |
| 4,577,958 | 3/1986 | Phillips | 355/43 |
| 4,635,373 | 1/1987 | Miyazaki et al. | 33/180 R |
| 4,697,087 | 9/1987 | Wu | 250/548 |
| 4,699,515 | 10/1987 | Tanimoto et al. | 356/40 |
| 4,768,883 | 9/1988 | Waldo et al. | 356/399 |
| 4,907,035 | 3/1990 | Galburt et al. | 356/150 |
| 5,003,342 | 3/1991 | Nishi | 355/43 |
| 5,194,743 | 3/1993 | Aoyama | 250/548 |

FOREIGN PATENT DOCUMENTS

63-107139  5/1988  Japan.

*Primary Examiner*—Frank Gonzalez
*Assistant Examiner*—Michael P. Stafira
*Attorney, Agent, or Firm*—Skjerven, Morrill, MacPherson, Franklin & Friel LLP; David T. Millers

[57] ABSTRACT

A prealignment and global alignment system in a semiconductor wafer lithography system includes reflected light microscopes which form images of a wafer near a wafer loading position. The reflected light microscopes are mounted on the perimeter of a main projection lens assembly and have large object areas, typically about 5 mm wide so that features of the wafer are in the object areas even when the wafer is loaded with a very coarse alignment of about ±2.5 mm. The prealignment system identifies points on the wafer's edge to align the wafer for a first projection. For second and subsequent projections, the alignment system identifies alignment marks on the wafer to globally align the wafer. Magnification of the microscopes may be increased during global alignment to provide greater accuracy and precision. Prealignment and global alignment are performed while the wafer is at or near the loading position, can be performed in parallel with projection of a pattern on a second wafer, and can be performed quickly with only small movements of the wafer.

32 Claims, 4 Drawing Sheets

ALIGNMENT SYSTEM WITH LARGE AREA SEARCH FOR WAFER EDGE AND GLOBAL MARKS

BACKGROUND OF THE INVENTION

1. Field of the Invention

This invention relates to semiconductor wafer lithography systems and to prealignment and global alignment of wafers in such lithography systems.

2. Description of Related Art

During fabrication of an integrated circuit (IC), a wafer lithography system projects a pattern of light onto a photoresist layer on a semiconductor wafer. The projected light changes portions of the photoresist layer, so that developing the photoresist layer forms a mask which exposes or protects different portions of the wafer. The masked wafer is then removed to a reaction chamber where a process such as etching changes the exposed portions of the wafer. Typically, a wafer lithography system forms several masks on a wafer during IC fabrication, and the masks must be aligned with each other to form a working IC.

Initially, an alignment system aligns a wafer according to the wafer's edges so that a first mask formed on the wafer has a predictable location relative to the wafer's edges. After the first mask, masks are typically precision aligned using alignment marks formed in the first or subsequent masks. A precision alignment system identifies the alignment marks and positions the wafer relative to the alignment marks for superimposing a pattern on an already processed area. Before precision alignment, the wafer must be prealigned and globally aligned so that alignment marks are within the field of view of the precision alignment system. In a mechanical prealignment system, a precision transport arm rigidly attached to an x-y stage places a wafer on a wafer holder with a maximum deviation within the tolerance of the precision alignment system, typically about ±40 μm. The wafer may also be banked against alignment pins on the wafer holder during prealignment. Mechanical prealignment systems tend to be slow and can reduce the wafer lithography system's processing rate.

Mechanical prealignment has disadvantages in addition to being slow. For example, banking a wafer against pins can chip the wafer's edge. Also, if prealignment of one wafer is conducted in parallel with projection on a second wafer, vibrations from the prealignment may affect the projection, and a more complex and expensive mechanical prealigner is required to reduce vibrations. Some wafer lithography systems have insufficient space to mount a precision mechanical prealigner and transport arm on an x-y stage. Accordingly, alternative devices and methods for prealignment of wafers are desired which provide fast prealignment of a wafer edge for a first exposure and fast global alignment in subsequent exposures.

SUMMARY OF THE INVENTION

In accordance with this invention, a fast prealignment and global alignment system includes a reflected light microscope which forms images of a wafer near a loading position of the wafer. The reflected light microscope may be mounted on the perimeter of a main projection lens assembly and has a large object area, typically about 5 mm wide. The object area is positioned near the loading position of the wafer which is outside the projection area of the main projection lens assembly. The wafer either when loaded or after a short step has an edge in the object area. The large object area allows fast load of a wafer with a very coarse alignment having a maximum deviation of about ±2.5 mm from a target location.

An image processor searches an image formed by the reflected light microscope to find the edge of the wafer for prealignment and orientation for projection of a first pattern. For second and subsequent projections, the image processor searches for alignment marks in images formed by the reflected light microscope. The images formed by the microscope have a sufficient field of view to allow a global alignment of the wafer even when a wafer is very coarsely positioned on a stage. The wafer may be aligned to two alignment marks at different x and y co-ordinates. If desired the magnification of the microscope is increased for global alignment to provide greater accuracy and precision. Prealignment and global alignment are performed while the wafer is still at or near the loading position.

For faster prealignment and global alignment, multiple reflected light microscopes are mounted with object areas over different search areas on the wafer's edge and interior when the wafer is at or near the loading position. With multiple microscopes, less movement of the wafer is required to locate the edge positions for determining alignment and orientation. Accordingly, prealignment and global alignment is performed quickly.

In accordance with one embodiment of this invention, a wafer lithography system includes: a projection lens assembly, an x-y stage which moves a wafer from a loading position where a wafer is loaded on the x-y stage to a projection position where the projection lens projects a light pattern onto the wafer; a reflected light microscope having an object area including a portion of the wafer when the wafer is near the loading position; and an image processor which analyzes a first image formed by the reflected light microscope and determines a displacement required to move the wafer from the loading position to the projection position.

Typically, multiple microscopes speed up measurements of edge and alignment mark locations for prealignment and global alignment, and microscopes with multiple magnifications provide a larger search area for prealignment and greater precision for global alignment.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
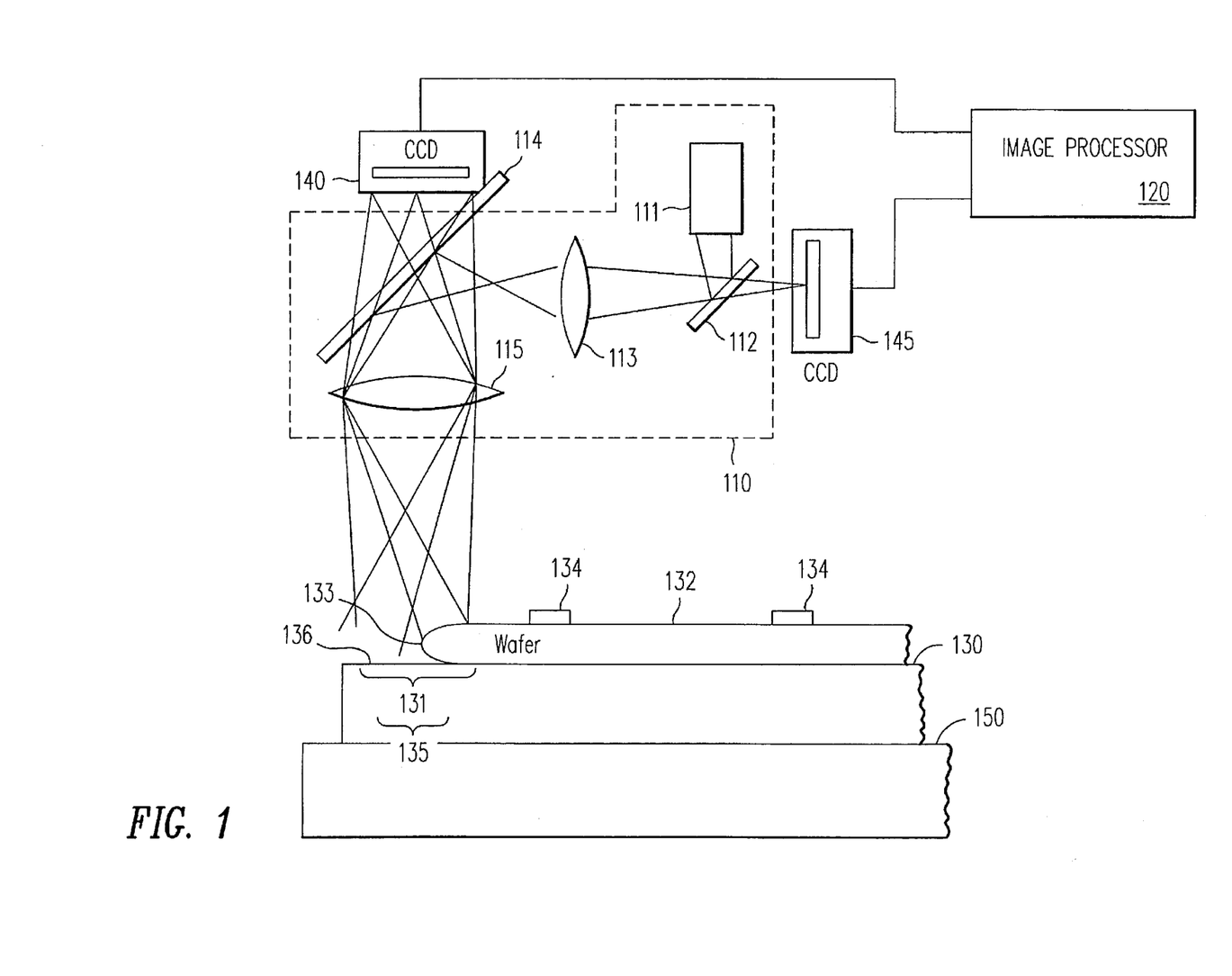
FIG. 1 shows a block diagram of a prealignment system in accordance with an embodiment of this invention.

In accordance with an embodiment of this invention, a prealignment system shown in FIG. 1 uses a microscope 110 and an image processor 120 to image and analyze a portion of a wafer 132 while wafer 132 is near a loading position and outside the projection area of a conventional main projection lens assembly (not shown). The locations of wafers loaded into the loading position vary according to variations in wafer size and the precision of a conventional loading system (not shown) which places wafer 132 on wafer holder 130. A loading system which provides only a very coarse prealignment (typically with a maximum deviation of about ±2.5 mm) of wafer 132 on wafer holder 130 can be employed.

Microscope 110 is selected such that for expected variations in position and size of a wafer 132, an object area 131 of microscope 110 includes a portion of an edge 133 of wafer 132. During prealignment before the first pattern is formed on wafer 132, image processor 120 searches an image of object area 131 to locate edge 133. Images of different portions of wafer 132, formed either in parallel using one or more additional microscopes (not shown) or in series by moving the different portions of edge 133 into object area 131, provide edge locations necessary for determining the wafer's position, diameter, and orientation relative to a wafer alignment notch or flat (not shown). A displacement required to move wafer 132 from the loading position to a projection position under the main projection lens-assembly is determined from the measured position and orientation of wafer 132.

Instead of the wafer's edge 133, microscope 110 and image processor 120 can prealign wafer 132 using conventional global alignment marks 134 or other surface features such as circuit patterns on wafer 132. A prealignment step before a first exposure of wafer 132, identifies the location of edge 133 to provide a measurement of the wafer's position and orientation suitable for projection of the first pattern. Subsequent prealignment steps identify the locations of alignment marks 134 or other features to provide a measurement of the position and orientation of structures on wafer 132. Image processor 120 searches a lower magnification but larger field of view image to find alignment marks 134 when the position of wafer 132 is known only to the accuracy of the mechanical alignment. Wafer 132 can then be repositioned slightly for forming a higher magnification, smaller field of view image that allows location of alignment mark 134 with sufficient precision to position wafer 132 for a precision alignment system (not shown).

In one specific embodiment of the prealignment system of FIG. 1, wafer 132 is placed on wafer holder 130 within ±2.5 mm of a target location. Wafer holder 130 may be for example a vacuum chuck or any other holder suitable for wafer 132. Wafer holder 130 is mounted on a conventional precision x-y stage 150 capable of rotating and moving wafer holder 131 and wafer 132 in a plane.

Wafer 132 has an edge with a substantially circular portion and an alignment notch or flat to indicate the crystallographic orientation of wafer 132. The notch or flat is also placed with a maximum deviation of ±2.5 mm from of an expected location. For a typical vacuum chuck wafer holder 130, misorientation by more than about 2.5 mm causes a malfunction of the vacuum hold down of wafer 132, but complete misorientation of wafer 132 would be acceptable if the hold down function and the correction range of rotation of wafer holder 130 and x-y stage 131 are sufficient. A misorientation of wafer 132 greater than the field of view of microscope 110 would require a step and search routine which could be implemented in the system if desired.

Microscope 110 is a reflected light microscope which projects light on an object area and forms an image from the light reflected from the object area. Microscope 110 contains a light source 111 which may be any of many well known light sources such as a tungsten lamp and a filter that removes all but yellow light. Concerns in selecting a light source include sufficient intensity at wavelengths which do not alter photoresist and minimal intensity at wavelengths that do. A precision alignment system (not shown) can share light source 111. Light from light source 111 reflects from a half silvered mirror 112, passes through an optical system 113, reflects off a half silvered mirror 114, and passes through an optical system 115 to illuminate object area 131.

In an alternative embodiment, light source 111 is eliminated, wafer holder 130 transmits light, and wafer 132 is backlit by a light source under wafer holder 130. Microscope 110 and image processor 120 measure the location of edge 133 by detecting the transition from light to dark in the image. This alternative embodiment cannot be used in many wafer lithography systems because precision x-y stage 150 is under wafer holder 130 and wafer 132 and insufficient space is available for a light'source. Additionally, backlighting cannot be used when identifying features such as alignment marks 134 on the top surface of wafer 132 because backlighting does not illuminate the top surface.

Optical system 115 forms an image using light from the portions of wafer 132 and wafer holder 130 in object area 131. The image is formed in a charge coupled device (CCD) camera 140 which provides an image signal to image processor 120. The image signal from CCD camera 140 to image processor 120 indicates image brightness along scan lines. An example of a suitable CCD camera 140 is an XC77 high resolution monochrome CCD camera available from Sony, Inc., but many other alternative CCD cameras or photosensors can be employed.

Light from microscope 110 striking object area 131 has an angular distribution that depends on the optical properties of optical systems 113 and 115, but ideally should be nearly perpendicular to the top surface of semiconductor wafer 132. In order to observe a wafer's edge, a numerical aperture (N.A.) of less than about 0.05 is preferred. Semiconductor wafers are typically reflective. The top surface of wafer 132 reflects light back to optical system 115 and causes relatively bright areas in the image formed. Near edge 133, wafer 132 is rounded to reduce chipping. The rounded surface of wafer 132 reflects less light back toward optical system 115 and causes a darker area in the image. The top surface of wafer holder 130 is nearly perpendicular to light rays from optical system 115 and reflects light back to optical system 115. Accordingly, the image formed by optical system 115 is relatively bright for flat areas of wafer 132, darkens near the edge 133, and brightens past edge 133.

A reflective coating 136 such as aluminum or gold on wafer holder 130 increases light reflection from wafer holder 130 and provides better image contrast at edge 133. However, it is found that partially reflective materials such as glass or a polished ceramic provide sufficient contrast for locating edge 133.

Optical system 115 is e.g. a three element microscope objective with N.A. of 0.05 designed to provide a 1× magnification image in CCD camera 140. Image processor 120 searches for edge 133 in the image formed in CCD camera 140. Ways of searching for image features with image processor 120 are known in the art and include dividing the image into pixels having digitized intensities, and then determining the edge by locating of abrupt change in intensity. Pixels in several scan lines can be averaged together to reduce noise in the intensities. Image processor 120 can also find an edge by determining the best correlation between a measured intensity pattern and a model intensity pattern. Image processor 120 can be a general purpose or special purpose computer. One special purpose image processor for analyzing images is available commercially from Cognex, Inc. of Needham, Mass. Typical special purpose image processors can correlate a measured image with a searched-for pattern in a time less than about 100 ms.

In one embodiment of this invention, each pixel in the image formed in CCD camera 140 is an intensity from an area about 10 µm wide in object area 131. Edge 133 can be identified in the image to the nearest pixel, or standard interpolation techniques may be used to identify edge 133 to a fraction of a pixel. Matching pixels with corresponding points in object area 131 locates edge 133 to a precision of about ±3 µm. The location of edge 133 may be differ from the actual location of edge 133 by a fixed offset and a system error. If all lithography on wafer 132 is done with the same lithography system, repeatability of the fixed offset is more important than the size of the offset, and the offset can be ignored.

The error and the offset are thought to result partly because not all of the image of edge 133 is in focus at once. For example, the focus of optical system 115 is fixed for convenience at the same location for prealignment to edge 133 and global alignment to global alignment marks 134, and a numerical aperture of about 0.1 and focusing on the top surface of wafer 132 are preferred. Surface variations on the flat portion of the top surface of wafer 132 being relatively small (about ±20 µm) are nearly focused, but the imaged portion of rounded edge 133 extends down about half the thickness of wafer 132 (about 350 µm for a 200 mm diameter wafer). The top surface of wafer holder 130 is the full thickness of wafer 132 (about 700 µm for a 200 mm diameter wafer) below the top surface of wafer 132. Accordingly, when optical system 115 is focused on the top surface of wafer 132, the top surface of wafer holder 130 and some of rounded portion of the surface of wafer 132 are out of focus. Using a smaller numerical aperture below 0.05 for optical system 115 reduces focus problems by providing a greater depth of focus. Also, optical system 115 could be focused on a plane that is half the average thickness of wafer 132 above the top surface of wafer holder 130 for imaging edge 133.

Another problem encountered when identifying edge 133 is that rounding of edges varies from wafer to wafer. Accordingly, the light intensity patterns of reflected light near the edges vary from wafer to wafer making the edges more difficult to locate by pattern matching. Variations in rounding is found not to be a problem alignments with error about ±3 µm.

If desired, optical system 115 can be calibrated to determine the fixed offset between the measured and the actual locations of edge 133. One factory calibration method turns off light source 111 and backlights wafer 132 with a source of parallel light. Only parallel light passing outside edge 133 reaches optical system 115 for formation of an image. Light is not reflected from different height surfaces or subject to the focusing problems of cones of reflected light. Accordingly, the sharp contrast between a dark image of wafer 132 and bright area outside wafer 132 is believed to provide an accurate measure of the location of edge 133.

Optical system 113 forms a magnified image in a CCD camera 145. Optical system 113 is e.g. a 3× relay lens. CCD camera 145 may be a Sony XC77 video camera as disclosed above. As an alternative to the embodiment of FIG. 1, optical system 113 and CCD camera 145 are eliminated, and a mechanical system changes lenses in optical system 115 to change the magnification of the image formed in CCD camera 140. In still another alternative embodiment, CCD camera 140 is eliminated and a mechanical system moves optical system 113 in and out of the optical path to CCD camera 145. A mechanical system which changes lenses has the disadvantage of creating vibrations which may disturb a projection on a second wafer (not shown) by the main projection lens assembly (not shown) and requires more time than electronic switching between CCD cameras 140 and 145.

The magnified image formed in CCD camera 145 has between about 3 and about 5 times the magnification of the image formed in CCD camera 140 but is an image of an object area 135 smaller than object area 131. Image processor 120 identifies patterns or edges in the image formed in CCD camera 145 in the same manner disclosed above. In one mode of operation, analysis of the image formed in CCD camera 140 provides a coarse prealignment of wafer 132, and analysis of the image formed in CCD camera 145 provides a finer global alignment of wafer 132. If necessary, wafer 132 is moved using the information gained during coarse prealignment so that either edge 133 or one of alignment marks 134 is within object area 135. Accordingly, global alignment of wafer 132 is achieved while wafer 132 is still near the loading position. The wafer can then be moved directly to the exposure position.

Figure 2A:
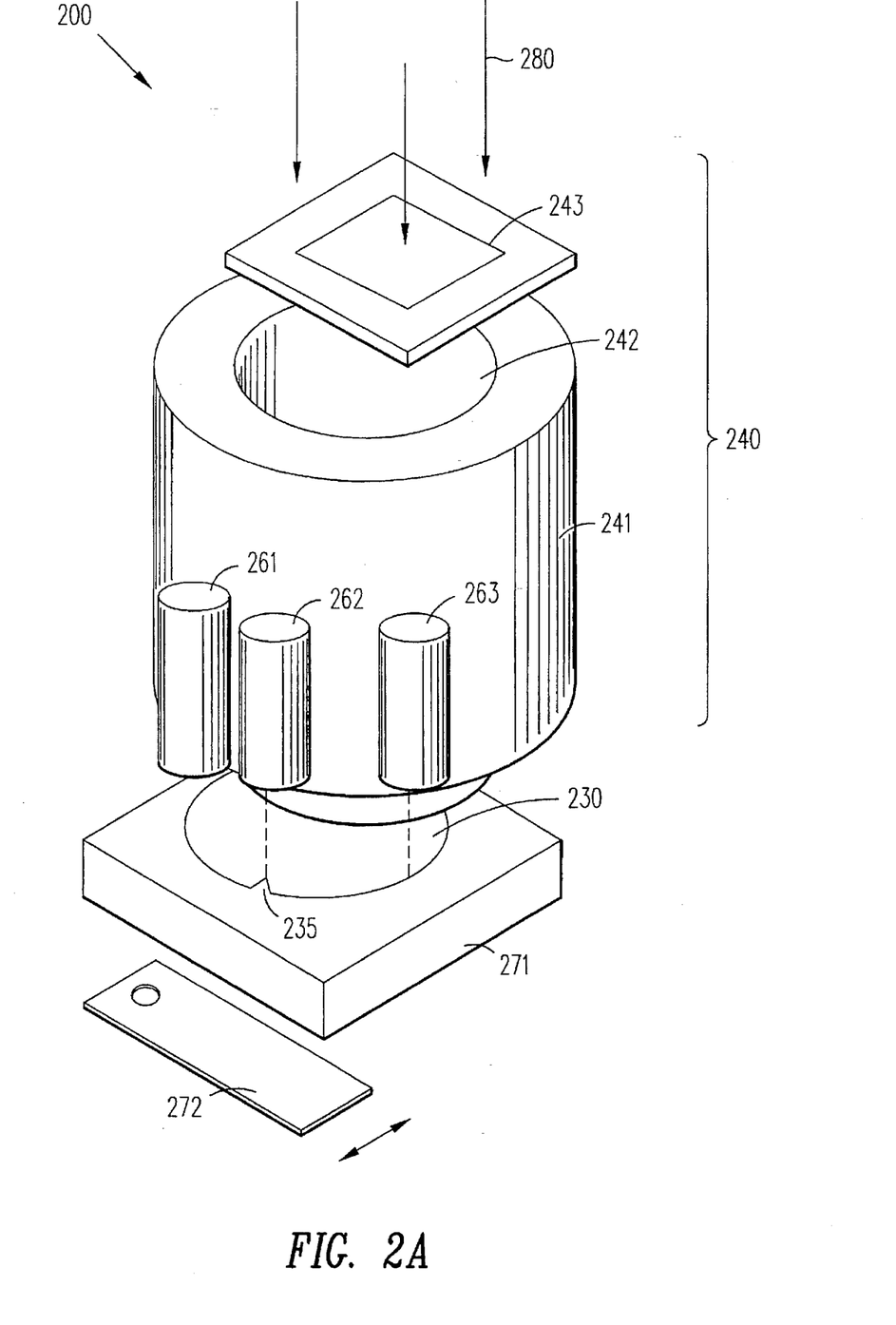
FIG. 2A shows a perspective view of a wafer lithography system in accordance with an embodiment of the present invention.

FIG. 2A shows a perspective view of a lithography system 200 in accordance with an embodiment of the present invention. Many sub-systems such as a precision alignment system, a reticle alignment system, and illumination system which would be found in an actual lithography system are not shown in FIG. 2A to more clearly illustrate the invention. System 200 includes multiple reflected light microscopes 261 to 263 mounted on a lens and reticle support structure 241 of a main projection lens assembly 240. More generally, microscopes 261 to 263 are positioned to form images of wafer 230 for prealignment and global alignment of wafer 230 while wafer 230 is at or near its loading position.

Figure 2B:
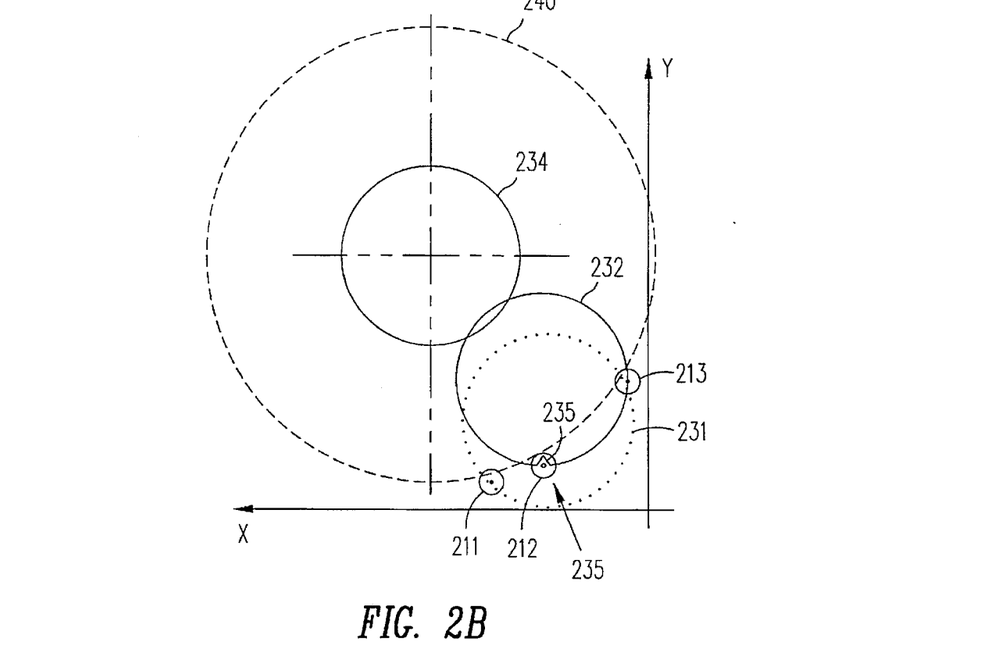
FIGS. 2B and 2C show the relative positions of a projection lens assembly, a notched wafer, and object areas during prealignment and global alignment of the lithography system of FIG. 2A.
Figure 2C:
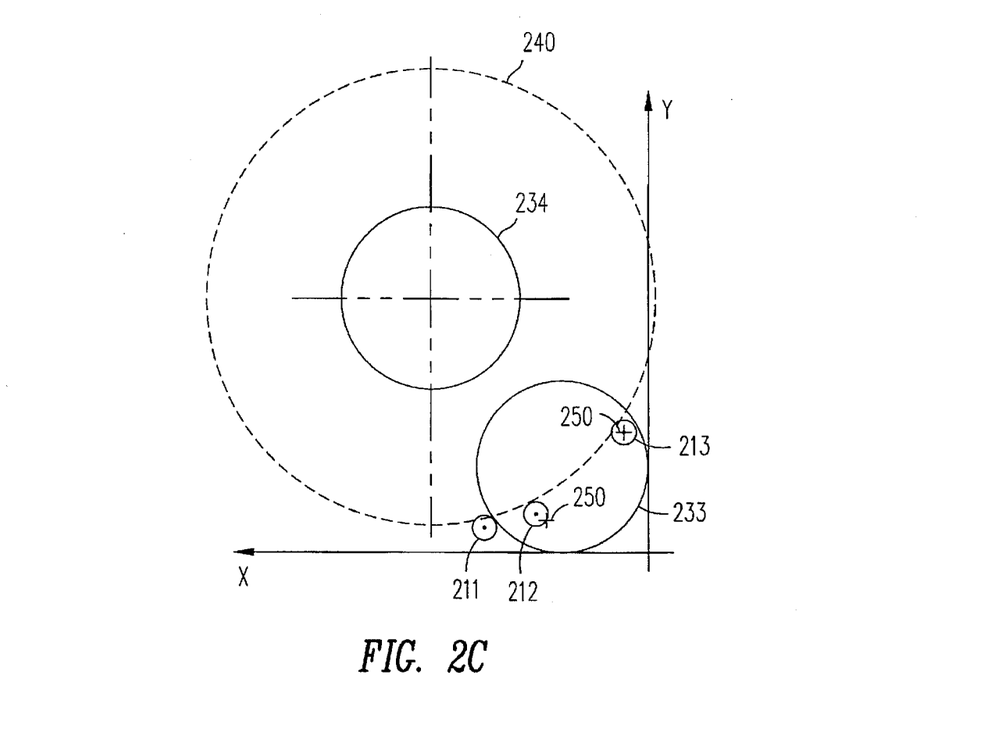

FIGS. 2B and 2C illustrate a process for prealigning and globally aligning a notched wafer 230 using lithography system 200 and are described in conjunction with FIG. 2A. Initially, a conventional loading arm 272 places wafer 230 on a conventional x-y stage 271 at a loading position 233 (FIG. 2C) with a positioning uncertainty (or an expected maximum deviation) that can be greater than 1 mm and is typically about ±2.5 mm. Loading position 233 is located near the edge of projection lens assembly 240 (the outer diameter of which is shown in outline 240 in FIGS. 2B and 2C).

The three reflected light microscopes 261 to 263 have object areas 211 to 213 which intersect loading position 233 and contain squares of width twice the loading position uncertainty (up to about 5 mm wide). In contrast, a typical fine alignment system (not shown) has object areas in a position 234 within the perimeter of projection lens assembly 240 where a pattern is projected on wafer 230, and the object areas for the fine alignment system are typically less than about 80 µm wide.

The positions of object areas 211 to 213 are selected for convenient mounting of microscopes 261 to 263 on projection lens assembly 240 and for imaging widely separate portions of the edge of wafer 230 when wafer 230 is in loading position 233. Wider separations between measured edge locations allow more accurate determinations of wafer 230's diameter. Additionally, the location of object area 212 is selected to minimize the movement required when forming images of alignment marks as disclosed below. When wafer 230 is translated a short distance from loading position 233 to position 231, two different portions of the edge of wafer 230 are in object areas 211 and 213. Images of areas 211 and 213 are simultaneously formed by reflected light microscopes 261 and 263 and searched by an image processor (not shown) to locate two points on the edge of wafer 130 which helps determine the diameter of wafer 230.

X-Y stage 271 which also positions wafer 230 for fine alignment and projection, moves wafer 230 a distance δx in an x direction and a distance δy in a y direction to a position 232. In position 232, an alignment notch 235 is within object area 212. An image of object area 212 is formed and searched to locate alignment notch 235. A second image of object area 213 gives the location of a point on the edge of wafer 230 relative to alignment notch 235. Given distances δx and δy and the measured locations of alignment notch 235 and the three points on the edge of wafer 230, geometry yields the diameter, position, and orientation of wafer 230 up to the precision of the microscopes 261 to 262 and x-y stage 271.

In a first lithography operation performed on wafer 230, the position and orientation of wafer 230 are known to the accuracy of the edge measurements described above, and x-y stage 271 moves wafer 230 to position 234 for projection of a first pattern. A reticle 243 contains an image of a pattern to be projected. Typically, light 280 passing through reticle 243 is focused by a main projection lens 242 onto an exposure area on wafer 230. The light alters regions of photoresist on wafer 230 exposed according to the pattern on reticle 243.

In a step-and-repeat lithography system, the pattern is projected on to a first exposure field of wafer 230 when in position 234, and then wafer 230 is moved a step distance for projection of another exposure field. The steps and projections are conventionally repeated until patterns are formed on all of wafer 230's exposure fields. Typically, each exposure field contains an identical copy of a circuit pattern and alignment marks 250 for the pattern. After projection is complete, the wafer is removed from lithography system 200 for developing of a mask and processing of wafer 230. When returned to lithography system 200 for a second or subsequent lithography operation, alignment marks 250 on the wafer can be used for global and fine alignment.

In a second or subsequent lithography operation, prealignment and global alignment is performed by measuring the location of alignment marks 250 for global alignment of wafer 230. In loading position 233 (or after a short translation from loading position 233) at least one of alignment marks 250 is in object areas 211 to 213 as shown in FIG. 2C. The image processor determines both the x and y locations of alignment marks 250 that are imaged. At least two alignment marks are required for a global alignment which measures the position and orientation of wafer 230. Wafer 230 can be moved again if necessary so that a second (or third) alignment mark 250 is in one of the object areas 211 to 213, and alignment marks 250 from different exposure fields, not located at the same x or y co-ordinate, may be used for global alignment.

Reflected light microscopes 261 to 263 used for imaging the edge of wafer 230 during prealignment for the first pattern form images of alignment marks 250 during global alignment. The magnification of microscopes 261 to 263 can be increased for imaging alignment marks 250 because information gained at lower magnification can be used to position alignment marks 250 for a more precise global alignment performed at higher magnification. Images of the alignment marks do not suffer from the same focus problems encountered in edge alignment because alignment marks are practically co-planar with the top surface of the wafer.

From the position and orientation measured during prealignment and global alignment, the image processor determines a rotation and displacement required to move wafer 230 to position 234 for projection of a pattern, and x-y stage 271 moves and rotates the wafer. If the global alignment is done precisely enough and x-y stage 271's precision is high enough, the pattern can be projected based on the global alignment. Typically, in a step-and-repeat lithography system, a precision alignment system (not shown) in projection assembly 240 does a fine alignment to locate each exposure field before projecting a copy of a pattern. Conventional fine alignment uses the alignment marks previously formed in the exposure field.

Figure 3A:
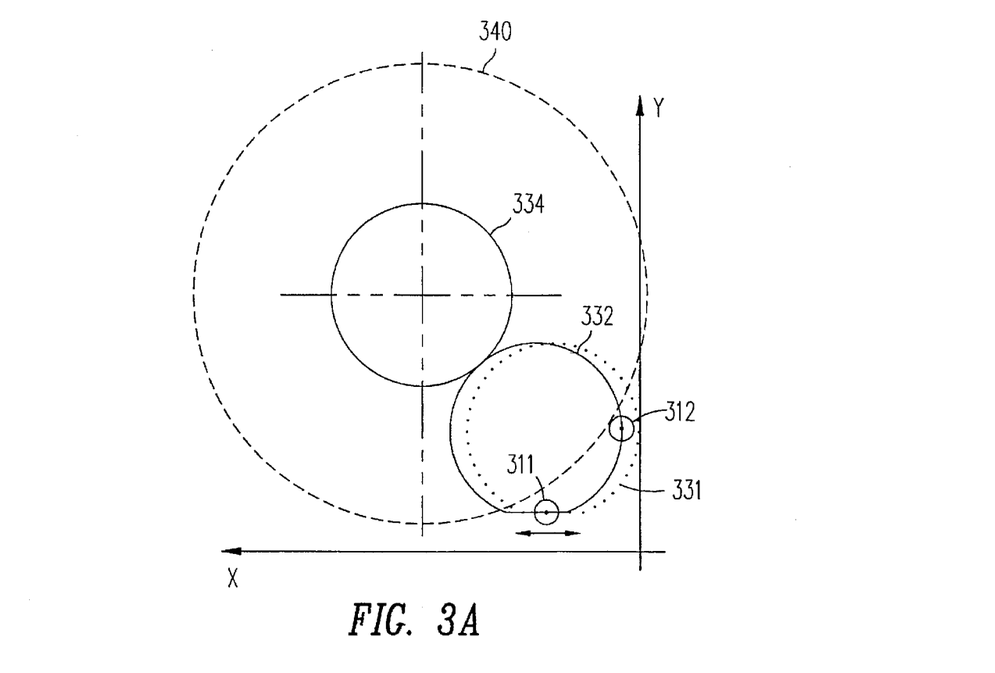
FIGS. 3A and 3B show the relative positions of a projection lens assembly, a flatted wafer, and object areas during prealignment and global alignment in accordance with another embodiment of this invention.
Figure 3B:
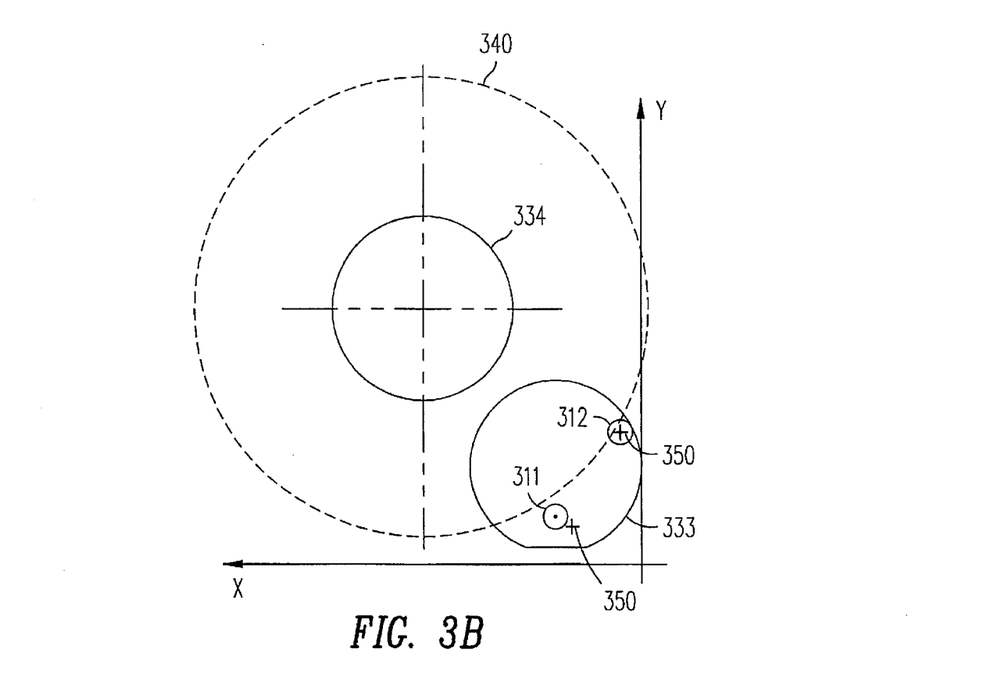

FIGS. 3A and 3B illustrate a process for prealignment and global alignment of a wafer using a pair of reflected light microscopes having object areas 311 and 312. Initially, a wafer is loaded or moved with very coarse alignment into a position 331 near a lens projection assembly 340. The wafer has an edge which has a flat but is otherwise substantially circular. The very coarse alignment positions the flat parallel to a known direction, the x direction in FIG. 3A. In position 331, a portion of the flat is in an object area 311 of a first reflected light microscope. The first reflected light microscope mounted on projection assembly 340 and forms an image of the portion of the flat in object area 311, and an image processor measures the location of the flat portion.

The wafer is then moved a short step to position 332 where a second portion of the flat is in object area 331, and a curved portion of the edge of the wafer is in object area 312. Such movement is along a direction expected to be parallel to the flat, the x direction. Images of object areas 311 and 312 are formed, and the image processor locates two more points on the edge of the wafer, one on the flat and the other on the curved portion of the edge of the wafer. From the three points on the edge of the wafer, the wafer's location and orientation are determined. In a manner similar to that described in regard to FIG. 2B, a displacement required to move the wafer to a position 334 for a first lithography operation is determined from the alignment of the edge.

FIG. 3B illustrates global alignment using a pair of microscopes by moving the wafer until alignment marks 350 are in object areas 311 and 312. The image processor identifies the x and y location of alignment marks 350 either simultaneously or sequentially after short translations and determines the offset and rotation required to move the wafer to position 334 for precision local alignment and projection of a pattern.

The embodiments of FIGS. 2A, 2B, 2C, 3A, and 3B use multiple microscopes and require only relatively short steps or movement of a wafer from the loading position to do prealignment and global alignment. An alternative embodiment of this invention having a single microscope forms the images described above but requires a series of steps including moving the wafer a distance about equal to its diameter for alignment. Such long steps are time consuming, and increased speed is a prime concern in many lithography system.

Although the present invention has been described with reference to particular embodiments, the description is only an example of the invention's application and should not be taken as a limitation. Various other adaptations and combinations of features of the embodiments disclosed will be apparent to those skilled in the art and are within the scope of the present invention as defined by the following claims.

We claim:

1. A wafer lithography system, comprising:
   a projection lens assembly;
   an x-y stage which moves a wafer from a first position where the wafer is loaded on the x-y stage to a second position where the projection lens assembly projects light onto the wafer;
   a plurality of microscopes, each microscope being fixedly mounted to the projection lens assembly and having an object area including a portion of the wafer when the wafer is in the first position; and
   an image processor which searches a first image formed by the microscope and determines a displacement required to move the wafer to the second position.

2. The wafer lithography system of claim 1, further comprising a second microscope having an object area including a second portion of the wafer when the wafer is in the first position.

3. The wafer lithography system of claim 2, further comprising a third microscope having an object area including a third portion of the wafer when the wafer is in the first position.

4. The wafer lithography system of claim 1, wherein the image processor comprises means for identifying a location of an edge of the wafer.

5. The wafer lithography system of claim 4, wherein the image processor further comprises means for identifying a location of an alignment mark on the wafer.

6. The wafer lithography system of claim 5, wherein:
   the microscope has a low magnification and a high magnification;
   the first image is formed at the low magnification;
   the means for identifying an alignment mark determines the position of the alignment mark to a first precision, from the first image;
   the microscope forms a second image at the high magnification; and
   the means for identifying an alignment mark determines the position of the alignment mark to a second precision, from the second image.

7. The wafer lithography system of claim 1 1, wherein the microscope is mounted on a perimeter of the projection lens assembly.

8. The wafer lithography system of claim 1, wherein the object area of the microscope has a width at least twice the maximum deviation.

9. The wafer lithography system of claim 8, wherein the maximum deviation is greater than about 1 mm.

10. The wafer lithography system of claim 1, further comprising a first CCD camera coupled to the image processor, wherein the microscope comprises a first optical system which forms a first image in the first CCD camera and the first CCD camera provides an image signal representing the first image to the image processor.

11. The wafer lithography system of claim 10, further comprising a second CCD camera coupled to the image processor, wherein the microscope further comprises a second optical system which forms a second image in the second CCD camera and the second CCD camera provides an image signal representing the second image to the image processor.

12. The wafer lithography system of claim 11, wherein the microscope further comprises a half silvered mirror disposed between the first optical system and the first CCD camera, the half silvered mirror transmitting a first portion of light from the first optical system to form an image in the first CCD and reflecting a second portion of the light from the first optical system to the second optical system.

13. A method for prealigning a wafer in a wafer lithography system, comprising the steps of:
   loading a wafer onto an x-y stage so that a location of an edge of the wafer is known to within an expected maximum deviation;
   forming a first image of an object area containing a portion of the edge, wherein a width of the object area is at least twice the expected maximum deviation; and
   determining the location of the edge from the first image.

14. The method of claim 13, further comprising the steps of:
   forming a second image of a second object area containing a second portion of the edge;
   forming a third image of a third object area containing a third portion of the edge; and
   determining the diameter of the wafer from the first, second, and third images.

15. The method of claim 13, wherein the object area contains an alignment notch in the wafer.

16. The method of claim 13, wherein the imaging step comprises forming an image with a reflected light microscope.

17. The method of claim 13, wherein the edge of the wafer has a flat and is otherwise substantially circular, and the object area contains a portion of the flat.

18. The method of claim 17, wherein the step of forming an image comprises forming an image with a reflected light microscope, and the method further comprises:
   moving the wafer so that a second portion of the flat can be imaged by the reflected light microscope;
   forming a second image of the second portion of the flat with the reflected light microscope;
   determining from the second image the location of the second portion of the flat; and
   determining the orientation of the wafer from the first and second images.

19. The method of claim 18, wherein the step of moving the wafer comprises the step of moving the wafer along a direction approximately parallel to the flat.

20. The method of claim 14, wherein the expected maximum deviation is greater than about 1 mm.

21. A method for prealigning a wafer in a wafer lithography system, comprising:
   loading a wafer onto an x-y stage so that the wafer has a location which is known to within an expected maximum deviation;
   forming a first image of an object area containing a feature on the wafer, wherein a width of the object area is at least twice the expected maximum deviation;
   locating the feature from the first image;
   determining from the location of the feature a motion which will position the wafer for alignment by an alignment system; and
   positioning the wafer for alignment by the alignment system.

22. The method of claim 21, wherein locating the feature further comprises locating an edge of the wafer.

23. The method of claim 21, wherein locating the feature further comprises locating an alignment mark on the wafer.

24. The method of claim 21, wherein forming the first image further comprises forming an image of the wafer while at least a portion of the wafer is outside a perimeter of a projection lens assembly of the wafer lithography system.

25. The method of claim 21, wherein locating the feature further comprises:

searching the first image for the feature;

moving the wafer to position the feature in a second object area;

forming a second image of the second object area, wherein the second image has a higher magnification than the first image; and determining the location of the feature from the second image.

26. The method of claim 25, wherein forming the first image further comprises forming an image with a reflected light microscope; and forming the second image further comprises forming an image with the reflected light microscope that formed the first image.

27. The method of claim 21, further comprising:

forming a second image of a second object area containing a second feature on the wafer, wherein a width of the second object area is at least twice the expected maximum deviation, and the second image is formed while the wafer is in a position where the first image is formed; and locating the second feature from the second image, wherein determining the motion which positions the wafer for an alignment system, further comprises determining the motion from the locations of the first and second features.

28. The method of claim 27, wherein forming the first image comprises forming an image with a first reflected light microscope; and forming the second image comprises forming an image with a second reflected light microscope.

29. A water lithography system, comprising:

a projection lens assembly;

an x-y stage which moves a wafer from a first position where the wafer is loaded on the x-y stage to a second position where the projection lens assembly projects light onto the wafer;

a microscope that for a first image has an object area including a portion of the wafer when the wafer is in the first position, wherein the object area of the microscope covers a maximum deviation in position expected when the wafer is loaded onto the x-y stage; and an image processor which searches the first image formed by the microscope and determines a displacement required to move the wafer to the second position.

30. The system of claim 29, wherein the image processor further determines a rotation required to orient the wafer in the second position.

31. The system of claim 29, wherein the microscope is fixedly mounted relative to the lens assembly.

32. The system of claim 1, wherein the image processor further determines a rotation required to orient the wafer in the second position.

* * * * *